United States Patent [19]

Davis

[11] 3,964,008
[45] June 15, 1976

[54] TARGET RESET MECHANISM
[75] Inventor: Lee A. Davis, Audubon, N.J.
[73] Assignee: ITE Imperial Corporation, Spring House, Pa.
[22] Filed: Feb. 3, 1975
[21] Appl. No.: 546,626

[52] U.S. Cl. .............................................. 335/272
[51] Int. Cl.² ........................................ H01H 85/38
[58] Field of Search ................. 335/78, 80, 81, 179, 335/205, 229, 234, 272; 340/373, 376; 317/27 R

[56] References Cited
UNITED STATES PATENTS

| | | |
|---|---|---|
| 2,872,628 | 2/1959 | Buchtenkirch .................. 335/222 X |
| 3,118,138 | 1/1964 | Milas et al. ..................... 335/272 X |
| 3,140,431 | 7/1964 | Schalkwijk ...................... 335/272 X |
| 3,735,215 | 5/1973 | Conrad ............................ 317/27 R |

Primary Examiner—J. D. Miller
Assistant Examiner—Fred E. Bell
Attorney, Agent, or Firm—Ostrolenk, Faber, Gerb & Soffen

[57] ABSTRACT

A magnetic mechanism for resetting a magnetic target device by reversing the direction of flux in the device yoke without requiring the energization of an electrical reset circuit. A pivotable member is provided to hold the target reset mechanism captive in a position spaced from the target mechanism when the reset mechanism is not in use.

4 Claims, 3 Drawing Figures

TARGET RESET MECHANISM

BACKGROUND OF THE INVENTION

The present invention relates to magnetic target devices and in particular to a novel magnetic mechanism for resetting a magnetic target device without requiring the energization of an electrical reset circuit.

It is known to provide electrical equipment with an indicator device having a magnetically actuatable target which displays a desired bit of information when an electrical "Set" pulse of current is caused to flow through a target coil of the indicator device, such as described in U.S. Pat. No. 3,140,553, issued July 14, 1964 to Taylor. The target information is magnetically held to alert an operator to the need for some act of intervention. The target of the indicator device is reset by the operator when that intervention has occurred. The previous method for resetting a magnetic target was by passing an electrical "Reset" pulse of current through the target coil in the opposite direction from the "Set" pulse, as is described in U.S. Pat. No. 3,735,215, issued May 22, 1973, and U.S. Pat. No. 3,599,045, issued Oct. 3, 1969, both to the assignee of the present invention.

In none of the above patents is it possible to produce a pulse of current through the target coil in the reset direction when the equipment is shut down and voltage is not available.

BRIEF DESCRIPTION OF THE INVENTION

It is desirable to be able to easily reset the target face of each indicator device contained in an electrical equipment even when there is no voltage available within the equipment to produce a pulse of current through the target coil in the reset direction.

In accordance with the invention, a target reset mechanism realizing this goal includes a permanent magnet of sufficient strength to reverse the direction of flux in the magnetic yoke of the indicator device. A pole of the magnet is placed in proximity to an arm of the target yoke, the magnet pole having the opposite polarity to that of the adjacent yoke arm, to cause a change in the direction of flux in the yoke, thereby causing the indicator device target to reset with a drab-colored surface viewable. A pivotable member is provided to hold the magnet captive in a position rotated away from the indicator device when the target reset mechanism is not in use.

The target reset mechanism just described has the advantage that it permits the resetting of the target face of an indicator device when there is no voltage available to produce a pulse of current through the target coil in the reset direction and allows a plurality of indicator devices to each be separately reset.

Accordingly, it is one primary object of the present invention to permit resetting the target of a magnetic target indicator device.

Another object of the present invention is to provide means for such resetting without the use of a pulse of current through the target coil in the resetting direction, in the event that no voltage is available for that purpose.

A further object is to provide a mechanism capable of such resetting, which mechanism is permanently attached to the equipment of which the indicator device is a part to permit such resetting of a single indicator mechanism without resetting additional indicator devices which may be contained thereon.

The above as well as other objects of the invention will become apparent from the following description of the accompanying drawings.

DETAILED DESCRIPTION OF THE INVENTION

Figure 1:
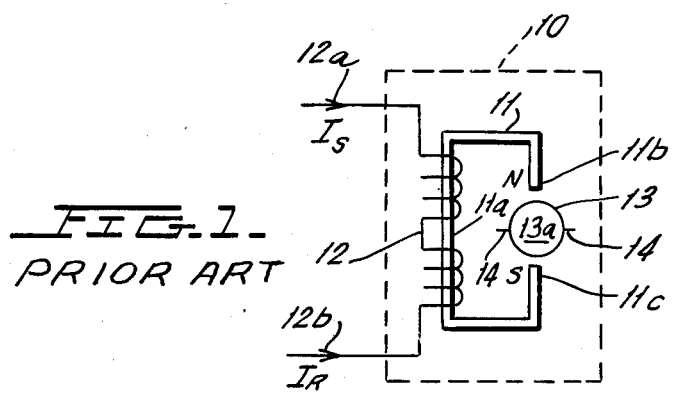
FIG. 1 is a schematic representation of a prior art magnetic target indicator device.

Referring to all of the drawings, indicator device 10 includes a generally U-shaped yoke 11 of ferromagnetic material having a target coil 12 wound around the cross portion 11a thereof. An essentially circular magnetic target 13 of a ferromagnetic material is positioned with its center along a line from, and at equal distances to, the ends of each arm 11b, 11c of magnetic yoke 11. Magnetic target 13 includes pivot means 14 radially extending from the edge of target disc 13 in a direction transverse to the line between the free end of each yoke arm 11b and 11c. Target disc 13 has a first surface 13a which is drably colored, preferably by a color which blends with the color of the equipment housing into which indicator mechanism 10 will ultimately be installed. The opposite target disc surface 13b has a bright and easily seen color, preferably a color which denotes danger or warning, e.g. International Orange.

In operation, magnetic yoke 11 is initially magnetized by known means such that yoke arms 11b and 11c are magnetically polarized to magnetically attract target disc 13 with its drab surface 13a consistently facing outward through the front of indicator device 10 so that it may be easily observed by maintenance personnel. For purposes of explanation, yoke arm end 11b and 11c are shown as being north and south magnetic poles, respectively. It should be understood that the opposite polarity convention may be as easily utilized.

Upon the occurrence of a condition requiring the actuation of the target, known means coupled to one lead 12a of target coil 12 causes a pulse of current to flow into the coil in the setting direction, as indicated by arrow $I_S$. Yoke 11 is fashioned of a ferromagnetic material having a "soft" magnetization characteristic, such that the pulse of setting current flowing into coil 12 reverses the magnetic polarity at the free ends of the magnetic yoke. The polarity reversal causes target disc 13 to change its alignment by 180° and rotate about pivot means 14 until the brightly-colored, opposite face 13b is displayed through the front aperture 10a of indicator device 10, thereby signalling a warning condition.

The previous method of resetting the target disc 13 was by coupling a pulse of electrical current to a second lead 12b of target coil 12 to flow in the opposite direction, as indicated by arrow $I_R$, from the set pulse current flow. The reset pulse reverses the temporary magnetization of yoke free ends 11b and 11c and target disc 13 is again rotated through an angle of 180° about pivoting means 14 to again display its drab face 13b through the front of aperture 10a of indicator device 10.

Figure 2:
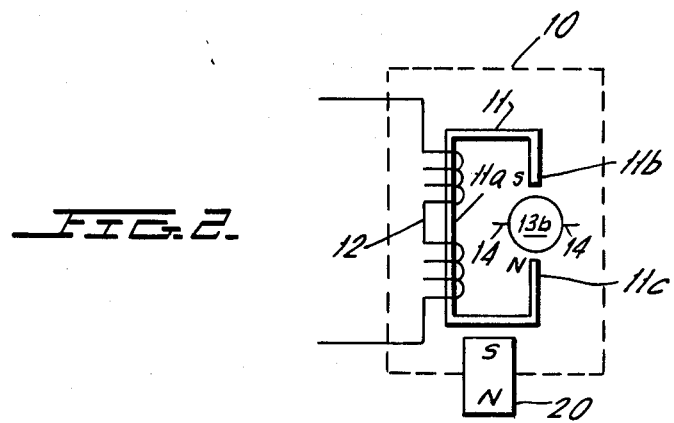
FIG. 2 is a schematic representation of the indicator device and of a permanent magnet being utilized in accordance with the invention to reset that indicator device.

A target reset mechanism in accordance with the invention includes a permanent magnet 20 of sufficient strength and reverse polarity such that when placed in proximity to one end of the target yoke the magnet 20 will change the direction of flux in the yoke and cause the target disc 13 to rotate through an angle of 180° about pivot means 14 until the drab surface 13a of the target disc is facing outwardly through the front aperture 10a of indicator device 10. In the example illustrated in FIG. 2, target disc 13 had been previously rotated into the danger-color-surface 13b visible condition, as hereabove described. In this condition, one yoke arm end 11b has a south magnetic polarization and the other yoke arm end 11c has a north magnetic polarization. To reset the target disc, permanent magnet 20 is moved into a position with its south pole adjacent yoke arm 11c. Permanent magnet 20 is of sufficient strength to change the direction of magnetic flux of the "soft" ferromagnetic material of yoke 11 and change yoke arm 11c to the south magnetic polarization, whereupon the other yoke arm 11b must change to a north magnetic polarization, and cause target disc 13 to rotate about pivot means 14 through an arc of 180° until drab face 13b is again outwardly positioned from the front aperture 10a of indicator device 10.

Figure 3:
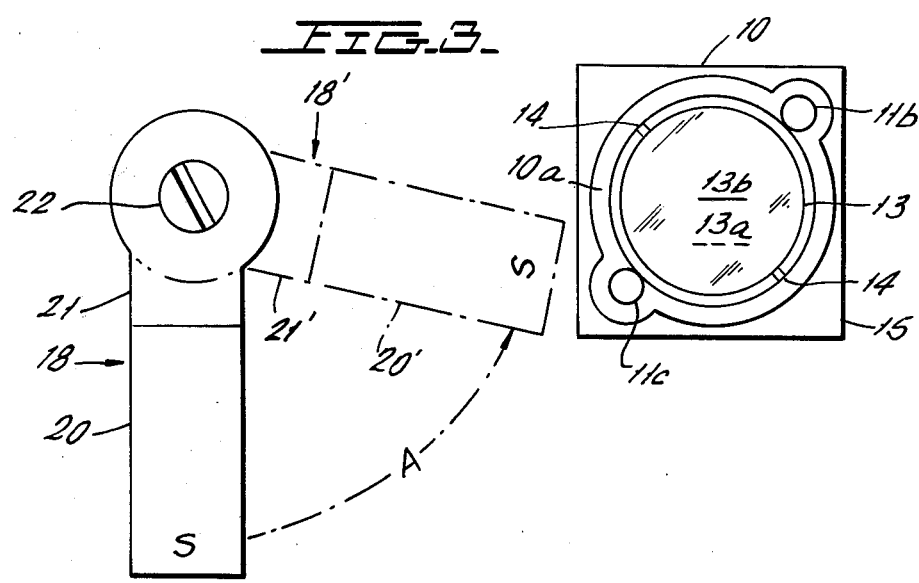
FIG. 3 is a plan view of a target reset mechanism in accordance with the invention and of an indicator device with which it is used.

Referring now to FIG. 3, a preferred embodiment of the target reset mechanism of the present invention includes means 18 for pivotally attaching permanent magnet 20 to the front panel of the housing of an electrical equipment. Pivot means 18 may be rotated between the magnet-adjacent-yoke-arm condition (18') for resetting the indicator mechanism, and the magnet-removed condition (18), to permit uninfluenced operation of indicator device 10. Permanent magnet 20 is fastened to one end of elongated member 21 whose other end has a suitable aperture therethrough for allowing passage of fastening means 22 into the equipment housing panel (not shown). During normal operation of the equipment, elongated member 21 is pivoted about fastening means 22 to a normal position where permanent magnet 20 is sufficiently removed from the indicator mechanism to have no effect upon the setting operation. A desired resetting operation is accomplished by rotating elongated member 21' in the direction of arrow A until the south pole of permanent magnet 20' is adjacent the desired yoke arm 11c of the indicator device 10. Once the operator has observed that the target disc 13 has rotated to present its drab face 13b through the front aperture 10a of the indicator device, the operator manually rotates the elongated member 21 of the target reset mechanism to its original reset position. In this manner, only the single indicator device 10 associated with a particular target reset mechanism 18 is reset.

There has just been described a novel target reset mechanism which is used to reset the target disc of a magnetic target indicator device without requiring the application of a pulse of current through the magnetic yoke in the reset direction and which allows the external resetting of an indicator device when no voltage is available within the equipment of which the indicator is a part.

The present invention has been described in connection with a preferred embodiment thereof; many variations and modifications will become apparent to those skilled in the art. It is preferred, therefore, that the present invention be limited not by the specific disclosure herein, but only by the appended claims.

What is claimed is:

1. A combination comprising:
an indicator device, including a target disc having a first and a second surface and a magnetic yoke having a magnetization winding wound thereon; said target disc being magnetically actuated by said yoke to visibly present said first surface responsive to a first pulse of current flowing through said yoke winding in a first direction; said target disc being magnetically actuated by said yoke to visibly present said second surface responsive to a second pulse of current flowing through said coil winding in a second direction; and
external means for selectably inducing a magnetic flux in said yoke when said external means is closely positioned thereto, whereby said target disc is magnetically actuated and one of said first and said second surfaces is caused to be visibly presented.

2. A combination as set forth in claim 1, wherein said external magnetic means is a permanent magnet of sufficient flux density and polarity to induce said magnetic flux in said yoke when said magnet is closely positioned to said yoke.

3. A combination as set forth in claim 1, further comprising first means for moving said external magnetic means between a first and a second position; said first position being sufficiently spaced from said indicator device to prevent said external magnetic means from affecting the operation of said indicator device; said second position being closely positioned to said yoke of said indicator device to cause said external magnetic means to induce said magnetic flux in said yoke.

4. A combination as set forth in claim 3, wherein said indicator means is mounted in an equipment panel and said first means includes an elongated member having an aperture at a first end thereof; and
second means passing through said aperture for attaching said elongated member to said panel;
said external magnetic means being attached to a second end of said elongated member opposite said first end; said second means being positioned on said panel to enable rotation between said first and said second positions.

* * * * *